(12) United States Patent
Shtrom et al.

(10) Patent No.: US 7,193,562 B2
(45) Date of Patent: Mar. 20, 2007

(54) CIRCUIT BOARD HAVING A PERIPHERAL ANTENNA APPARATUS WITH SELECTABLE ANTENNA ELEMENTS

(75) Inventors: Victor Shtrom, Sunnyvale, CA (US); Darin T. Milton, Campbell, CA (US); William S. Kish, Saratoga, CA (US)

(73) Assignee: Ruckus Wireless, Inc., Sunnyvale, CA (US)

( * ) Notice: Subject to any disclaimer, the term of this patent is extended or adjusted under 35 U.S.C. 154(b) by 94 days.

(21) Appl. No.: 11/022,080

(22) Filed: Dec. 23, 2004

(65) Prior Publication Data

US 2006/0109191 A1 May 25, 2006

Related U.S. Application Data

(60) Provisional application No. 60/630,499, filed on Nov. 22, 2004.

(51) Int. Cl.
*H01Q 1/38* (2006.01)
*H01Q 9/28* (2006.01)
*H01Q 3/24* (2006.01)

(52) U.S. Cl. .............................. 343/700 MS; 343/795; 343/876

(58) Field of Classification Search ......... 343/700 MS, 343/793, 795, 846, 876
See application file for complete search history.

(56) References Cited

U.S. PATENT DOCUMENTS

| | | | |
|---|---|---|---|
| 4,176,356 A | 11/1979 | Foster et al. |
| 4,193,077 A | 3/1980 | Greenberg et al. |
| 4,814,777 A | 3/1989 | Monser |
| 5,220,340 A | 6/1993 | Shafai |
| 5,754,145 A | 5/1998 | Evans |
| 5,767,809 A | 6/1998 | Chuang et al. |
| 6,034,638 A | 3/2000 | Thiel et al. |
| 6,094,177 A | 7/2000 | Yamamoto |
| 6,266,528 B1 | 7/2001 | Farzaneh |
| 6,292,153 B1 | 9/2001 | Aiello et al. |
| 6,307,524 B1 | 10/2001 | Britain |
| 6,326,922 B1 | 12/2001 | Hegendoerfer |
| 6,337,628 B2 | 1/2002 | Campana, Jr. |
| 6,337,668 B1 | 1/2002 | Ito et al. |
| 6,339,404 B1 | 1/2002 | Johnson et al. |

(Continued)

FOREIGN PATENT DOCUMENTS

EP 0534612 3/1993

(Continued)

*Primary Examiner*—Shih-Chao Chen
(74) *Attorney, Agent, or Firm*—Carr & Ferrell LLP (57) ABSTRACT

A circuit board for wireless communications includes communication circuitry for modulating and/or demodulating a radio frequency (RF) signal and an antenna apparatus for transmitting and receiving the RF signal, the antenna apparatus having selectable antenna elements located near one or more peripheries of the circuit board. A first antenna element produces a first directional radiation pattern; a second antenna element produces a second directional radiation pattern offset from the first radiation pattern. The antenna elements may include one or more reflectors configured to provide gain and broaden the frequency response of the antenna element. A switching network couples one or more of the selectable elements to the communication circuitry and provides impedance matching regardless of which or how many of the antenna elements are selected. Selecting different combinations of antenna elements results in a configurable radiation pattern; alternatively, selecting several elements may result in an omnidirectional radiation pattern.

36 Claims, 5 Drawing Sheets

U.S. PATENT DOCUMENTS

| | | |
|---|---|---|
| 6,356,243 B1 | 3/2002 | Schneider et al. |
| 6,377,227 B1 | 4/2002 | Zhu et al. |
| 6,392,610 B1 | 5/2002 | Braun et al. |
| 6,404,386 B1 | 6/2002 | Proctor, Jr. et al. |
| 6,407,719 B1 | 6/2002 | Ohira et al. |
| 6,445,688 B1 | 9/2002 | Garces et al. |
| 6,498,589 B1 | 12/2002 | Horii |
| 6,507,321 B2 | 1/2003 | Oberschmidt et al. |
| 6,753,814 B2 | 6/2004 | Killen et al. |
| 6,762,723 B2 | 7/2004 | Nallo et al. |
| 6,888,504 B2 | 5/2005 | Chiang et al. |
| 6,906,678 B2 | 6/2005 | Chen |
| 6,924,768 B2 | 8/2005 | Wu et al. |
| 6,950,019 B2 | 9/2005 | Bellone et al. |
| 7,034,770 B2 * | 4/2006 | Yang et al. ............... 343/793 |
| 7,064,717 B2 * | 6/2006 | Kaluzni et al. ............ 343/702 |
| 2002/0047800 A1 | 4/2002 | Proctor, Jr. et al. |
| 2002/0084942 A1 | 7/2002 | Tsai et al. |
| 2002/0105471 A1 | 8/2002 | Kojima et al. |
| 2002/0158798 A1 | 10/2002 | Chiang et al. |
| 2003/0030588 A1 | 2/2003 | Kalis et al. |
| 2003/0122714 A1 | 7/2003 | Wannagot et al. |
| 2003/0184490 A1 | 10/2003 | Raiman et al. |
| 2003/0189514 A1 | 10/2003 | Miyano et al. |
| 2003/0189521 A1 | 10/2003 | Yamamoto et al. |
| 2003/0189523 A1 | 10/2003 | Ojantakanen et al. |
| 2003/0210207 A1 | 11/2003 | Suh et al. |
| 2003/0227414 A1 | 12/2003 | Saliga et al. |
| 2001/0017310 A1 | 1/2004 | Runkle et al. |
| 2004/0014432 A1 | 1/2004 | Boyle |
| 2004/0017860 A1 | 1/2004 | Liu |
| 2004/0027291 A1 | 2/2004 | Zhang et al. |
| 2004/0027304 A1 | 2/2004 | Chiang et al. |
| 2004/0032378 A1 | 2/2004 | Volman et al. |
| 2004/0036651 A1 | 2/2004 | Toda |
| 2004/0041732 A1 | 3/2004 | Aikawa et al. |
| 2004/0048593 A1 | 3/2004 | Sano |
| 2004/0058690 A1 | 3/2004 | Ratzel et al. |
| 2004/0061653 A1 | 4/2004 | Webb et al. |
| 2004/0070543 A1 | 4/2004 | Masaki |
| 2004/0080455 A1 | 4/2004 | Lee |
| 2004/0095278 A1 | 5/2004 | Kanemoto et al. |
| 2004/0114535 A1 | 6/2004 | Hoffmann et al. |

FOREIGN PATENT DOCUMENTS

| | | |
|---|---|---|
| WO | WO 03/079484 | 9/2003 |

* cited by examiner

CIRCUIT BOARD HAVING A PERIPHERAL ANTENNA APPARATUS WITH SELECTABLE ANTENNA ELEMENTS

CROSS-REFERENCE TO RELATED APPLICATIONS

This application claims the priority benefit of U.S. provisional patent application No. 60/630,499, entitled "Method and Apparatus for Providing 360 Degree Coverage via Multiple Antenna Elements Co-Located with Electronic Circuitry on a Printed Circuit Board Assembly," filed Nov. 22, 2004, which is hereby incorporated by reference. This application is related to U.S. patent application Ser. No. 11/010,076 entitled "System and Method for an Omnidirectional Planar Antenna Apparatus with Selectable Elements," filed Dec. 9, 2004, which is also incorporated by reference.

BACKGROUND OF INVENTION

1. Field of the Invention

The present invention relates generally to wireless communications, and more particularly to a circuit board having a peripheral antenna apparatus with selectable antenna elements.

2. Description of the Prior Art

In communications systems, there is an ever-increasing demand for higher data throughput and a corresponding drive to reduce interference that can disrupt data communications. For example, in an IEEE 802.11 network, an access point (i.e., base station) communicates data with one or more remote receiving nodes (e.g., a network interface card) over a wireless link. The wireless link may be susceptible to interference from other access points, other radio transmitting devices, changes or disturbances in the wireless link environment between the access point and the remote receiving node, and so on. The interference may be such to degrade the wireless link, for example by forcing communication at a lower data rate, or may be sufficiently strong to completely disrupt the wireless link.

One solution for reducing interference in the wireless link between the access point and the remote receiving node is to provide several omnidirectional antennas for the access point, in a "diversity" scheme. For example, a common configuration for the access point comprises a data source coupled via a switching network to two or more physically separated omnidirectional antennas. The access point may select one of the omnidirectional antennas by which to maintain the wireless link. Because of the separation between the omnidirectional antennas, each antenna experiences a different signal environment, and each antenna contributes a different interference level to the wireless link. The switching network couples the data source to whichever of the omnidirectional antennas experiences the least interference in the wireless link.

However, one limitation with using two or more omnidirectional antennas for the access point is that each omnidirectional antenna comprises a separate unit of manufacture with respect to the access point, thus requiring extra manufacturing steps to include the omnidirectional antennas in the access point. A further limitation is that the omnidirectional antenna typically comprises an upright wand attached to a housing of the access point. The wand typically comprises a rod exposed outside of the housing, and may be subject to breakage or damage.

Another limitation is that typical omnidirectional antennas are vertically polarized. Vertically polarized radio frequency (RF) energy does not travel as efficiently as horizontally polarized RF energy inside a typical office or dwelling space, additionally, most laptop computer network interface cards have horizontally polarized antennas. Typical solutions for creating horizontally polarized RF antennas to date have been expensive to manufacture, or do not provide adequate RF performance to be commercially successful.

A still further limitation with the two or more omnidirectional antennas is that because the physically separated antennas may still be relatively close to each other, each of the several antennas may experience similar levels of interference and only a relatively small reduction in interference may be gained by switching from one omnidirectional antenna to another omnidirectional antenna.

SUMMARY OF INVENTION

A system comprises communication circuitry, a first antenna element, and a second antenna element. The communication circuitry is located in a first area of a circuit board and is configured to generate an RF signal into an antenna feed port of the circuit board. The first antenna element is located near a first periphery of the circuit board and is configured to produce a first directional radiation pattern when coupled to the antenna feed port. The second antenna element is located near a second periphery of the circuit board and is configured to produce a second directional radiation pattern offset from the first directional radiation pattern when coupled to the antenna feed port.

A method comprises generating an RF signal in communication circuitry located on a first area of a circuit board, routing the RF signal from the communication circuitry to an antenna feed port of the circuit board; and coupling the RF signal from the antenna feed port to a first antenna element and a second antenna element. The first antenna element is located near a first periphery of the circuit board and configured to produce a first directional radiation pattern when coupled to the antenna feed port. The second antenna element is located near a second periphery of the circuit board and is configured to produce a second directional radiation pattern offset from the first radiation pattern when coupled to the antenna feed port.

A circuit board comprises an antenna feed port configured to distribute an RF signal generated by communication circuitry located on the circuit board, a first antenna element located near a first periphery of the circuit board and configured to produce a first directional radiation pattern when coupled to the RF signal, and a second antenna element located near a second periphery of the circuit board and configured to produce a second directional radiation pattern offset from the first directional radiation pattern when coupled to the RF signal.

BRIEF DESCRIPTION OF DRAWINGS

The present invention will now be described with reference to drawings that represent a preferred embodiment of the invention. In the drawings, like components have the same reference numerals. The illustrated embodiment is intended to illustrate, but not to limit the invention. The drawings include the following figures.

DETAILED DESCRIPTION

A system for a wireless (i.e., radio frequency or RF) link to a remote receiving device includes a circuit board comprising communication circuitry for generating an RF signal and an antenna apparatus for transmitting and/or receiving the RF signal. The antenna apparatus includes two or more antenna elements arranged near the periphery of the circuit board. Each of the antenna elements provides a directional radiation pattern. In some embodiments, the antenna elements may be electrically selected (e.g., switched on or off) so that the antenna apparatus may form configurable radiation patterns. If multiple antenna elements are switched on, the antenna apparatus may form an omnidirectional radiation pattern.

Advantageously, the circuit board interconnects the communication circuitry and provides the antenna apparatus in one easily manufacturable printed circuit board. Including the antenna apparatus in the printed circuit board reduces the cost to manufacture the circuit board and simplifies interconnection with the communication circuitry. Further, including the antenna apparatus in the circuit board provides more consistent RF matching between the communication circuitry and the antenna elements. A further advantage is that the antenna apparatus radiates directional radiation patterns substantially in the plane of the antenna elements. When mounted horizontally, the radiation patterns are horizontally polarized, so that RF signal transmission indoors is enhanced as compared to a vertically polarized antenna.

Figure 1:
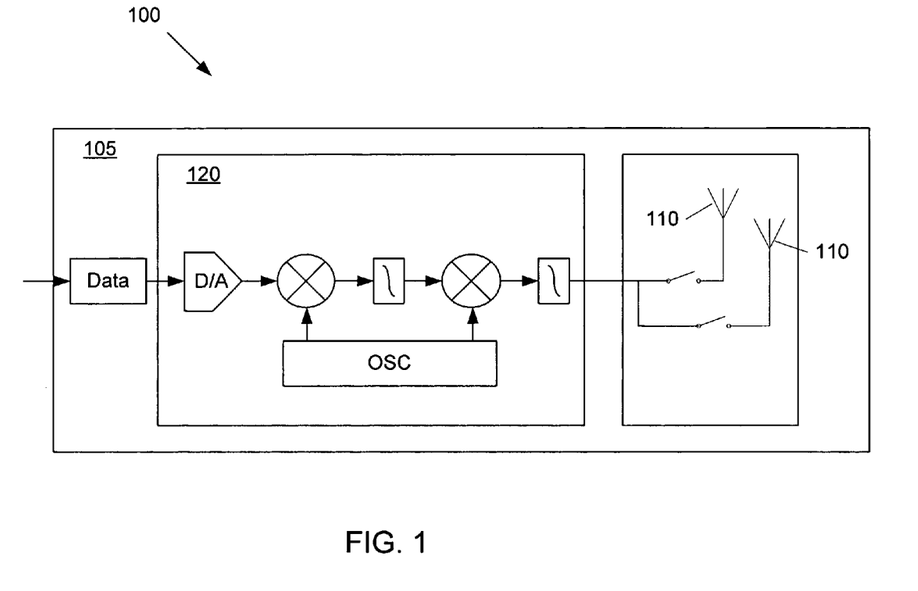
FIG. 1 illustrates an exemplary schematic for a system incorporating a circuit board having a peripheral antenna apparatus with selectable elements, in one embodiment in accordance with the present invention.

FIG. 1 illustrates an exemplary schematic for a system 100 incorporating a circuit board having a peripheral antenna apparatus with selectable elements, in one embodiment in accordance with the present invention. The system 100 may comprise, for example without limitation, a transmitter/receiver such as an 802.11 access point, an 802.11 receiver, a set-top box, a laptop computer, a television, a cellular telephone, a cordless telephone, a wireless VoIP phone, a remote control, and a remote terminal such as a handheld gaming device. In some exemplary embodiments, the system 100 comprises an access point for communicating to one or more remote receiving nodes over a wireless link, for example in an 802.11 wireless network.

The system 100 comprises a circuit board 105 including a radio modulator/demodulator (modem) 120 and a peripheral antenna apparatus 110. The radio modem 120 may receive data from a router connected to the Internet (not shown), convert the data into a modulated RF signal, and the antenna apparatus 110 may transmit the modulated RF signal wirelessly to one or more remote receiving nodes (not shown). The system 100 may also form a part of a wireless local area network by enabling communications among several remote receiving nodes. Although the disclosure will focus on a specific embodiment for the system 100 including the circuit board 105, aspects of the invention are applicable to a wide variety of appliances, and are not intended to be limited to the disclosed embodiment. For example, although the system 100 may be described as transmitting to a remote receiving node via the antenna apparatus 110, the system 100 may also receive RF-modulated data from the remote receiving node via the antenna apparatus 110.

Figure 2:
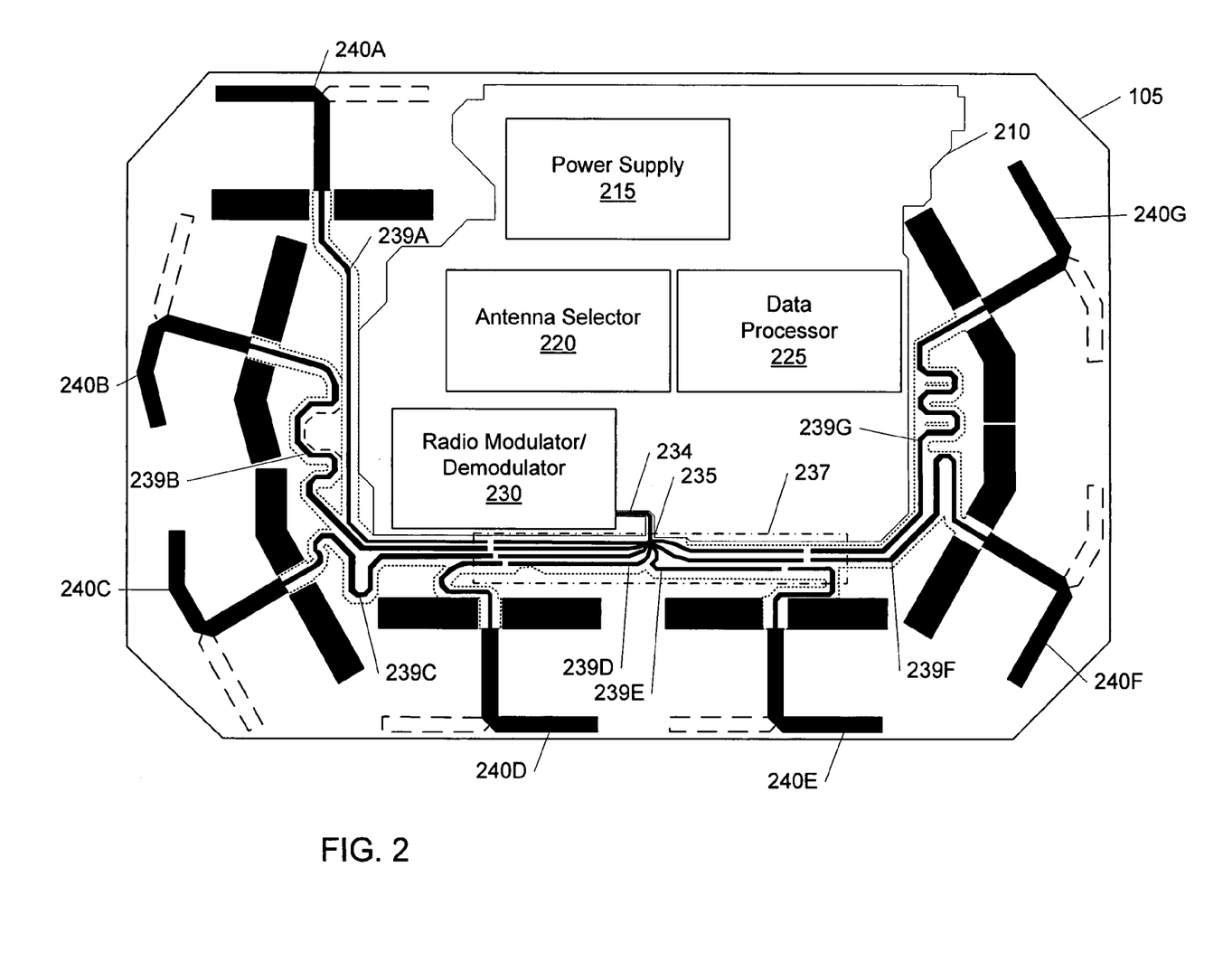
FIG. 2 illustrates the circuit board having the peripheral antenna apparatus with selectable elements of FIG. 1, in one embodiment in accordance with the present invention.

FIG. 2 illustrates the circuit board 105 having the peripheral antenna apparatus 110 with selectable elements of FIG. 1, in one embodiment in accordance with the present invention. In some embodiments, the circuit board 105 comprises a printed circuit board (PCB) such as FR4, Rogers 4003, or other dielectric material with four layers, although any number of layers is comprehended, such as six.

The circuit board 105 includes an area 210 for interconnecting circuitry including for example a power supply 215, an antenna selector 220, a data processor 225, and a radio modulator/demodulator (modem) 230. In some embodiments, the data processor 225 comprises well-known circuitry for receiving data packets from a router connected to the Internet (e.g., via a local area network). The radio modem 230 comprises communication circuitry including virtually any device for converting the data packets processed by the data processor 225 into a modulated RF signal for transmission to one or more of the remote receiving nodes, and for reception therefrom. In some embodiments, the radio modem 230 comprises circuitry for converting the data packets into an 802.11 compliant modulated RF signal.

From the radio modem 230, the circuit board 105 also includes a microstrip RF line 234 for routing the modulated RF signal to an antenna feed port 235. Although not shown, in some embodiments, an antenna feed port 235 is configured to distribute the modulated RF signal directly to antenna elements 240A–240G of the peripheral antenna apparatus 110 (not labeled) by way of antenna feed lines. In the embodiment depicted in FIG. 2, the antenna feed port 235 is configured to distribute the modulated RF signal to one or more of the selectable antenna elements 240A–240G by way of a switching network 237 and microstrip feed lines 239A–G. Although described as microstrip, the feed lines 239 may also comprise coupled microstrip, coplanar strips with impedance transformers, coplanar waveguide, coupled strips, and the like.

The antenna feed port 235, the switching network 237, and the feed lines 239 comprise switching and routing components on the circuit board 105 for routing the modulated RF signal to the antenna elements 240A–G. As described further herein, the antenna feed port 235, the switching network 237, and the feed lines 239 include structures for impedance matching between the radio modem 230 and the antenna elements 240. The antenna feed port 235, the switching network 237, and the feed lines 239 are further described with respect to FIG. 5.

As described further herein, the peripheral antenna apparatus comprises a plurality of antenna elements 240A–G located near peripheral areas of the circuit board 105. Each of the antenna elements 240 produces a directional radiation pattern with gain (as compared to an omnidirectional antenna) and with polarization substantially in the plane of the circuit board 105. Each of the antenna elements may be arranged in an offset direction from the other antenna elements 240 so that the directional radiation pattern produced by one antenna element (e.g., the antenna element 240A) is offset in direction from the directional radiation pattern produced by another antenna element (e.g., the antenna element 240C). Certain antenna elements may also be arranged in substantially the same direction, such as the antenna elements 240D and 240E. Arranging two or more of the antenna elements 240 in the same direction provides spatial diversity between the antenna elements 240 so arranged.

In embodiments with the switching network 237, selecting various combinations of the antenna elements 240 produces various radiation patterns ranging from highly directional to omnidirectional. Generally, enabling adjacent antenna elements 240 results in higher directionality in azimuth as compared to selecting either of the antenna elements 240 alone. For example, selecting the adjacent antenna elements 240A and 240B may provide higher directionality than selecting either of the antenna elements 240A or 240B alone. Alternatively, selecting every other antenna element (e.g., the antenna elements 240A, 240C, 240E, and 240G) or all of the antenna elements 240 may produce an omnidirectional radiation pattern.

The operating principle of the selectable antenna elements 240 may be further understood by review of co-pending U.S. patent application Ser. No. 11/010,076, entitled "System and Method for an Omnidirectional Planar Antenna Apparatus with Selectable Elements," filed Dec. 9, 2004, and previously incorporated herein by reference.

Figure 3A:
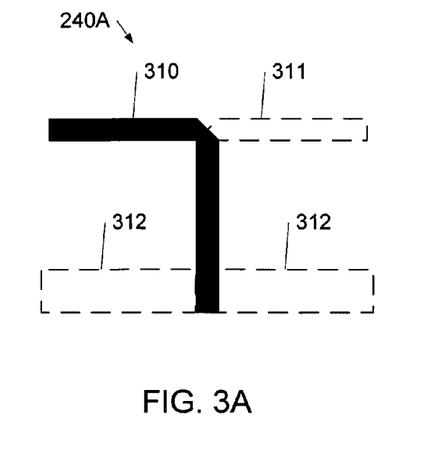
FIG. 3A illustrates a modified dipole for the antenna apparatus of FIG. 2, in one embodiment in accordance with the present invention.

FIG. 3A illustrates the antenna element 240A of FIG. 2, in one embodiment in accordance with the present invention. The antenna element 240A of this embodiment comprises a modified dipole with components on both exterior surfaces of the circuit board 105 (considered as the plane of FIG. 3A). Specifically, on a first surface of the circuit board 105, the antenna element 240A includes a first dipole component 310. On a second surface of the circuit board 105, depicted by dashed lines in FIG. 3, the antenna element 240A includes a second dipole component 311 extending substantially opposite from the first dipole component 310. The first dipole component 310 and the second dipole component 311 form the antenna element 240A to produce a generally cardioid directional radiation pattern substantially in the plane of the circuit board.

In some embodiments, such as the antenna elements 240B and 240C of FIG. 2, the dipole component 310 and/or the dipole component 311 may be bent to conform to an edge of the circuit board 105. Incorporating the bend in the dipole component 310 and/or the dipole component 311 may reduce the size of the circuit board 105. Although described as being formed on the surface of the circuit board 105, in some embodiments the dipole components 310 and 311 are formed on interior layers of the circuit board, as described herein.

The antenna element 240A may optionally include one or more reflectors (e.g., the reflector 312). The reflector 312 comprises elements that may be configured to concentrate the directional radiation pattern formed by the first dipole component 310 and the second dipole component 311. The reflector 312 may also be configured to broaden the frequency response of the antenna component 240A. In some embodiments, the reflector 312 broadens the frequency response of each modified dipole to about 300 MHz to 500 MHz. In some embodiments, the combined operational bandwidth of the antenna apparatus resulting from coupling more than one of the antenna elements 240 to the antenna feed port 235 is less than the bandwidth resulting from coupling only one of the antenna elements 240 to the antenna feed port 235. For example, with four antenna elements 240 (e.g., the antenna elements 240A, 240C, 240E, and 240G) selected to result in an omnidirectional radiation pattern, the combined frequency response of the antenna apparatus is about 90 MHz. In some embodiments, coupling more than one of the antenna elements 240 to the antenna feed port 235 maintains a match with less than 10 dB return loss over 802.11 wireless LAN frequencies, regardless of the number of antenna elements 240 that are switched on.

Figure 3B:
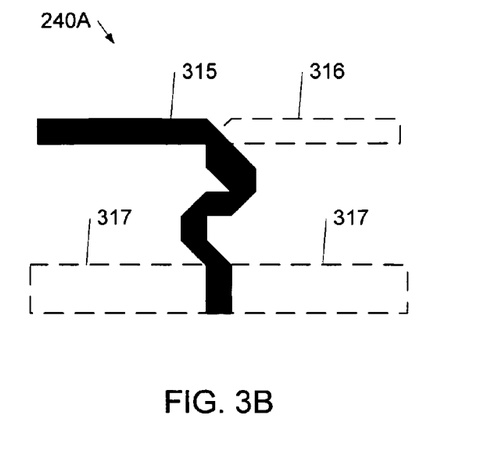
FIG. 3B illustrates a size reduced modified dipole for the antenna apparatus of FIG. 2, in an alternative embodiment in accordance with the present invention.

FIG. 3B illustrates the antenna element 240A of FIG. 2, in an alternative embodiment in accordance with the present invention. The antenna element 240A of this embodiment may be reduced in dimension as compared to the antenna element 240A of FIG. 3A. Specifically, the antenna element 240A of this embodiment comprises a first dipole component 315 incorporating a meander, a second dipole component 316 incorporating a corresponding meander, and a reflector 317. Because of the meander, the antenna element 240A of this embodiment may require less space on the circuit board 105 as compared to the antenna element 240A of FIG. 3A.

Figure 3C:
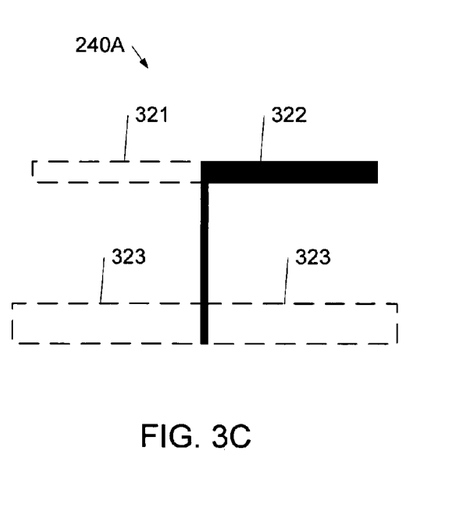
FIG. 3C illustrates an alternative modified dipole for the antenna apparatus of FIG. 2, in an alternative embodiment in accordance with the present invention.

FIG. 3C illustrates the antenna element 240A of FIG. 2, in an alternative embodiment in accordance with the present invention. The antenna element 240A of this embodiment includes one or more components on one or more layers internal to the circuit board 105. Specifically, in one embodiment, a first dipole component 321 is formed on an internal ground plane of the circuit board 105. A second dipole component 322 is formed on an exterior surface of the circuit board 105. As described further with respect to FIG. 4, a reflector 323 may be formed internal to the circuit board 105, or may be formed on the exterior surface of the circuit board 105. An advantage of this embodiment of the antenna element 240A is that vias through the circuit board 105 may be reduced or eliminated, making the antenna element 240A of this embodiment less expensive to manufacture.

Figure 3D:
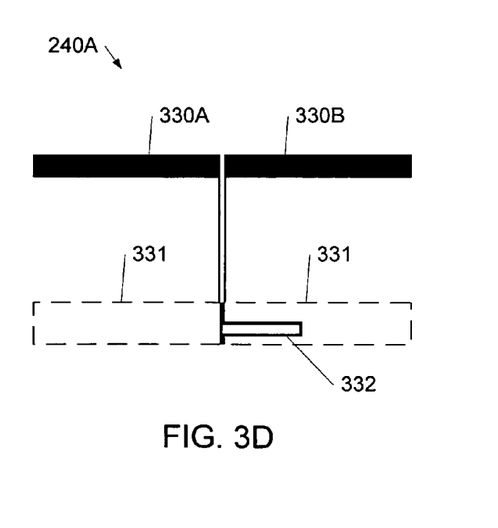
FIG. 3D illustrates a modified dipole with coplanar strip transition for the antenna apparatus of FIG. 2, in an alternative embodiment in accordance with the present invention.

FIG. 3D illustrates the antenna element 240A of FIG. 2, in an alternative embodiment in accordance with the present invention. The antenna element 240A of this embodiment includes a modified dipole with a microstrip to coplanar strip (CPS) transition 332 and CPS dipole arms 330A and 330B on a surface layer of the circuit board 105. Specifically, this embodiment provides that the CPS dipole arm 330A may be coplanar with the CPS dipole arm 330B, and may be formed on the same surface of the circuit board 105. This embodiment may also include a reflector 331 formed on one or more interior layers of the circuit board 105 or on the opposite surface of the circuit board 105. An advantage of this embodiment is that no vias are needed in the circuit board 105.

It will be appreciated that the dimensions of the individual components of the antenna elements 240A–G (e.g., the first dipole component 310, the second dipole component 311, and the reflector 312) depend upon a desired operating frequency of the antenna apparatus. Furthermore, it will be appreciated that the dimensions of wavelength depend upon conductive and dielectric materials comprising the circuit board 105, because speed of electron propagation depends upon the properties of the circuit board 105 material. Therefore, dimensions of wavelength referred to herein are intended specifically to incorporate properties of the circuit board, including considerations such as the conductive and dielectric properties of the circuit board 105. The dimensions of the individual components may be established by use of RF simulation software, such as IE3D from Zeland Software of Fremont, Calif.

Figure 4:
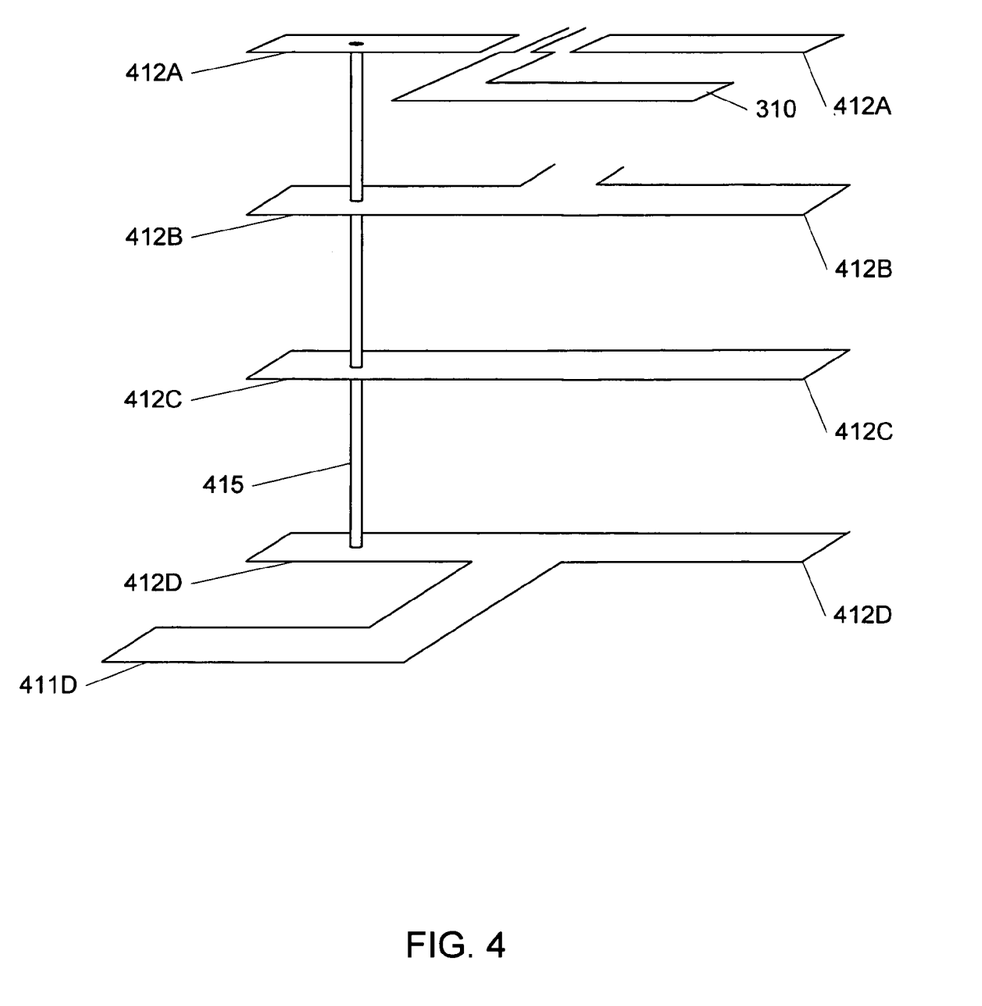
FIG. 4 illustrates the antenna element of FIG. 3A, showing multiple layers of the circuit board, in one embodiment of the invention.

FIG. 4 illustrates the antenna element 240A of FIG. 3A, showing multiple layers of the circuit board 105, in one embodiment of the invention. The circuit board 105 of this embodiment comprises a 60 mil thick stackup with three dielectrics and four metallization layers A–D, with an internal RF ground plane at layer B (10 mils from top layer A to the internal ground layer B). Layer B is separated by a 40 mil thick dielectric to the next layer C, which may comprise a power plane. Layer C is separated by a 10 mil dielectric to the bottom layer D.

The first dipole component 310 and portions 412A of the reflector 312 is formed on the first (exterior) surface layer A. In the second metallization layer B, which includes a connection to the ground layer (depicted as an open trace), corresponding portions 412B of the reflector 312 are formed. On the third metallization layer C, corresponding portions 412C of the reflector 312 are formed. The second dipole component 411D is formed along with corresponding portions of the reflector 412D on the fourth (exterior) surface metallization layer D. The reflectors 412A–D and the second dipole component 411B-D on the different layers are interconnected to the ground layer B by an array of metallized vias 415 (only one via 415 shown, for clarity) spaced less than 1/20th of a wavelength apart, as determined by an operating RF frequency range of 2.4–2.5 GHz for 802.11. It will be apparent to a person or ordinary skill that the reflector 312 comprises four layers, depicted as 412A–D.

An advantage of the antenna element 240A of FIG. 4 is that transitions in the RF path are avoided. Further, because of the cutaway portion of the reflector 412A and the array of vias interconnecting the layers of the circuit board 105, the antenna element 240A of this embodiment offers a good ground plane for the ground dipole 311 and the reflector element 312.

Figure 5A:
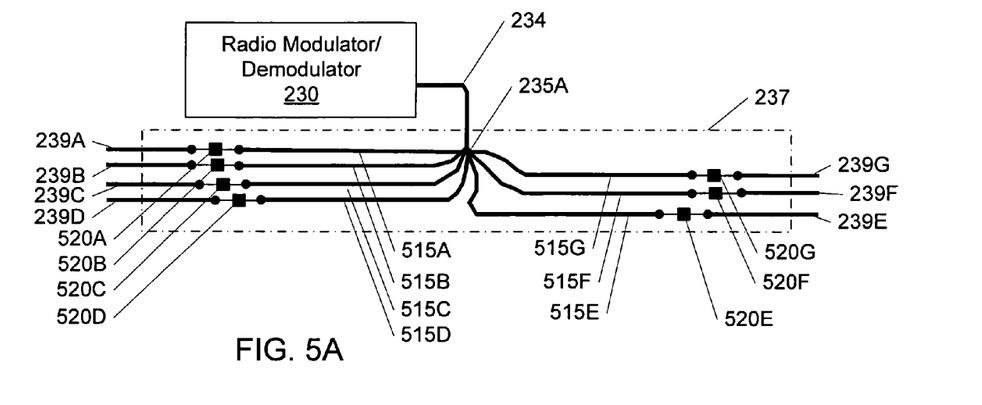
FIG. 5A illustrates the antenna feed port and the switching network of FIG. 2, in one embodiment in accordance with the present invention.

FIG. 5A illustrates the antenna feed port 235 and the switching network 237 of FIG. 2, in one embodiment in accordance with the present invention. The antenna feed port 235 of this embodiment receives the RF line 234 from the radio modem 230 into a distribution point 235A. From the distribution point 235A, impedance matched RF traces 515A–G extend to PIN diodes 520A–G. In one embodiment, the RF traces 515A–G comprise 20 mils wide traces, based upon a 10 mil dielectric from the internal ground layer (e.g., the ground layer B of FIG. 4). Feed lines 239A–G (only portions of the feed lines 239 are shown for clarity) extend from the PIN diodes 520A–G to each of the antenna elements 240.

Each PIN diode 520 comprises a single-pole single-throw switch to switch each antenna element 240 either on or off (i.e., couple or decouple each of the antenna elements 240 to the antenna feed port 235). In one embodiment, a series of control signals (not shown) is used to bias each PIN diode 520. With the PIN diode 520 forward biased and conducting a DC current, the PIN diode 520 is switched on, and the corresponding antenna element 240 is selected. With the PIN diode 520 reverse biased, the PIN diode 520 is switched off.

In one embodiment, the RF traces 515A–G are of length equal to a multiple of one half wavelength from the antenna feed port 235. Although depicted as equal length in FIG. 5A, the RF traces 515A–G may be unequal in length, but multiples of one half wavelength from the antenna feed port 235. For example, the RF trace 515A may be of zero length so that the PIN diode 520A is directly attached to the antenna feed port 235. The RF trace 515B may be one half wavelength, the RF trace 515C may be one wavelength, and so on, in any combination. The PIN diodes 520A–G are multiples of one half wavelength from the antenna feed port 235 so that disabling one PIN diode (e.g. the PIN diode 520A) does not create an RF mismatch that would cause RF reflections back to the distribution point 235A and to other traces 515 that are enabled (e.g., the trace 515B). In this fashion, when the PIN diode 540A is "off," the radio modem 230 sees a high impedance on the trace 515A, and the impedance of the trace 515B that is "on" is virtually unaffected by the PIN diode 540A. In some embodiments, the PIN diodes 520A–G are located at an offset from the one half wavelength distance. The offset is determined to account for stray capacitance in the distribution point 235A and/or the PIN diodes 520A–G.

Figure 5B:
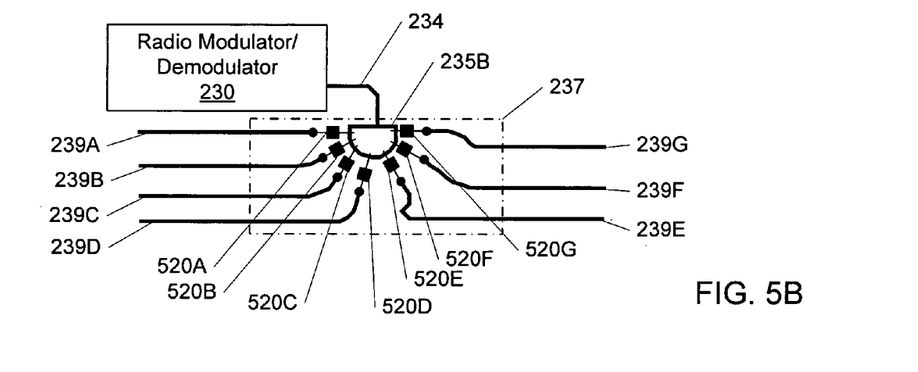
FIG. 5B illustrates the antenna feed port and the switching network of FIG. 2, in an alternative embodiment in accordance with the present invention.

FIG. 5B illustrates the antenna feed port 235 and the switching network 237 of FIG. 2, in an alternative embodiment in accordance with the present invention. The antenna feed port 235 of this embodiment receives the RF line 234 from the radio modem 230 into a distribution point 235B. The distribution point 235B of this embodiment is configured as a solder pad for the PIN diodes 520A–G. The PIN diodes 520A–G are soldered between the distribution point 235B and the ends of the feed lines 239A–G. In essence, the distribution point 235B of this embodiment acts as a zero wavelength distance from the antenna feed port 235. An advantage of this embodiment is that the feed lines extending from the PIN diodes 520A–G to the antenna elements 240A–G offer unbroken controlled impedance.

Figure 5C:
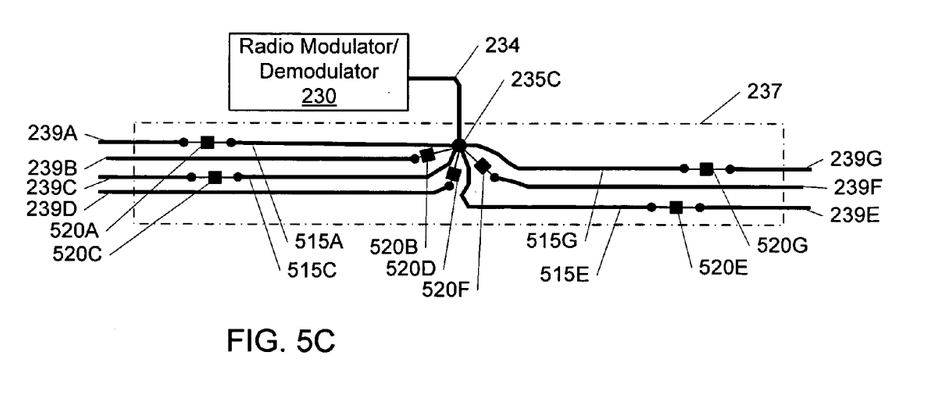
FIG. 5C illustrates the antenna feed port and the switching network of FIG. 2, in an alternative embodiment in accordance with the present invention.

FIG. 5C illustrates the antenna feed port and the switching network of FIG. 2, in an alternative embodiment in accordance with the present invention. This embodiment may be considered as a combination of the embodiments depicted in FIGS. 5A and 5B. The PIN diodes 520A, 520C, 520E, and 520G are connected to the RF traces 515A, 515C, 515E, and 515G, respectively, in similar fashion to that described with respect to FIG. 5A. However, the PIN diodes 520B, 520D, and 520F are soldered to a distribution point 235C and to the corresponding feed lines 239B, 239D, and 239F, in similar fashion to that described with respect to FIG. 5B.

Although the switching network 237 is described as comprising PIN diodes 520, it will be appreciated that the switching network 237 may comprise virtually any RF switching device such as a GaAs FET, as is well known in the art. In some embodiments, the switching network 237 comprises one or more single-pole multiple-throw switches. In some embodiments, one or more light emitting diodes (not shown) are coupled to the switching network 237 or the feed lines 239 as a visual indicator of which of the antenna elements 240 is on or off. In one embodiment, a light emitting diode is placed in circuit with each PIN diode 520 so that the light emitting diode is lit when the corresponding antenna element 240 is selected.

Referring to FIG. 2, because in some embodiments the antenna feed port 235 is not in the center of the circuit board 105, which would make the antenna feed lines 239 of equal length and minimum loss, the lengths of the antenna feed lines 239 may not comprise equivalent lengths from the antenna feed port 235. Unequal lengths of the antenna feed lines 239 may result in phase offsets between the antenna elements 240. Accordingly, in some embodiments not shown in FIG. 2, each of the feed lines 239 to the antenna elements 240 are designed to be as long as the longest of the feed lines 239, even for antenna elements 240 that are relatively close to the antenna feed port 235. In some embodiments, the lengths of the feed lines 239 are designed to be a multiple of a half-wavelength offset from the longest of the feed lines 239. In still other embodiments, the lengths of the feed lines 239 which are odd multiples of one half wavelength from the other feed lines 239 incorporate a "phase-inverted" antenna element 240 to compensate. For example, referring to FIG. 2, the antenna elements 240C and 240F are inverted by 180 degrees because the feed lines 239C and 239F are 180 degrees out of phase from the feed lines 239A, 239B, 239D, 239E, and 239G. In an antenna element 240 that is phase inverted, the first dipole component (e.g., surface layer) replaces the second dipole component (e.g., ground layer). It will be appreciated that this provides the 180 degree phase shift in the antenna element to compensate for the 180 degree feed line phase shift.

An advantage of the system 100 (FIG. 1) incorporating the circuit board 105 having the peripheral antenna apparatus with selectable antenna elements 240 (FIG. 2) is that the antenna elements 240 are constructed directly on the circuit board 105, therefore the entire circuit board 105 can be easily manufactured at low cost. As depicted in FIG. 2, one embodiment or layout of the circuit board 105 comprises a substantially square or rectangular shape, so that the circuit board 105 is easily panelized from readily available circuit board material. As compared to a system incorporating externally-mounted vertically polarized "whip" antennas for diversity, the circuit board 105 minimizes or eliminates the possibility of damage to the antenna elements 240.

A further advantage of the circuit board 105 incorporating the peripheral antenna apparatus with selectable antenna elements 240 is that the antenna elements 240 may be configured to reduce interference in the wireless link between the system 100 and a remote receiving node. For example, the system 100 communicating over the wireless link to the remote receiving node may select a particular configuration of selected antenna elements 240 that minimizes interference over the wireless link. For example, if an interfering signal is received strongly via the antenna element 240C, and the remote receiving node is received strongly via the antenna element 240A, selecting only the antenna element 240A may reduce the interfering signal as opposed to selecting the antenna element 240C. The system 100 may select a configuration of selected antenna elements 240 corresponding to a maximum gain between the system and the remote receiving node. Alternatively, the system 100 may select a configuration of selected antenna elements 240 corresponding to less than maximal gain, but corresponding to reduced interference. Alternatively, the antenna elements 240 may be selected to form a combined omnidirectional radiation pattern.

Another advantage of the circuit board 105 is that the directional radiation pattern of the antenna elements 240 is substantially in the plane of the circuit board 105. When the circuit board 105 is mounted horizontally, the corresponding radiation patterns of the antenna elements 240 are horizontally polarized. Horizontally polarized RF energy tends to propagate better indoors than vertically polarized RF energy. Providing horizontally polarized signals improves interference rejection (potentially, up to 20 dB) from RF sources that use commonly-available vertically polarized antennas.

The invention has been described herein in terms of several preferred embodiments. Other embodiments of the invention, including alternatives, modifications, permutations and equivalents of the embodiments described herein, will be apparent to those skilled in the art from consideration of the specification, study of the drawings, and practice of the invention. The embodiments and preferred features described above should be considered exemplary, with the invention being defined by the appended claims, which therefore include all such alternatives, modifications, permutations and equivalents as fall within the true spirit and scope of the present invention.

What is claimed is:

1. A peripheral antenna system, comprising:
    communication circuitry located in an interior area of a circuit board, the communication circuitry configured to generate an RF signal into a feed line distribution point of the circuit board;
    a first antenna element located near a first periphery of the circuit board, the first antenna element configured to produce a first directional radiation pattern when coupled to the feed line distribution point; and
    a second antenna element located near a second periphery of the circuit board, the second antenna element configured to produce a second directional radiation pattern offset from the first directional radiation pattern when coupled to the feed line distribution point, wherein the first antenna element and the second antenna element substantially surround the communication circuitry and the first antenna and second antenna element collectively produce substantially omnidirectional and horizontally polarized radiation coverage that is substantially in the plane of the circuit board when the first antenna element and the second antenna element are coupled to the feed line distribution point.

2. The peripheral antenna system of claim 1 further comprising a switching network configured to selectively couple the feed line distribution point to the first antenna element and the second antenna element.

3. The peripheral antenna system of claim 2, wherein the switching network comprises a first RF switch located at about a multiple of one-half wavelength from the feedline distribution point, the first RF switch configured to selectively couple the feed line distribution point to the first antenna element.

4. The peripheral antenna system of claim 1 further comprising:
    a first feed line of the circuit board configured to couple the feed Line distribution point to the first antenna element; and
    a second feed line of the circuit board configured to couple the feed line distribution point to the second antenna element, the second feed line having electrical length of about a multiple of one-half wavelength as compared to the first feed line.

5. The peripheral antenna system of claim 1, wherein the first antenna element comprises a modified dipole.

6. The peripheral antenna system of claim 5, wherein the modified dipole comprises a bent dipole component.

7. The peripheral antenna system of claim 5, wherein the first antenna element further comprises a reflector, the reflector configured to concentrate the radiation pattern of the first antenna element.

8. The peripheral antenna system of claim 5, wherein the first antenna element further comprises a reflector, the reflector configured to broaden the frequency response of the first antenna element.

9. The peripheral antenna system of claim 1, wherein the first antenna element comprises a first dipole component and a second dipole component, wherein at least one of the first dipole component and the second dipole component is formed on an exterior surface of the circuit board.

10. The peripheral antenna system of claim 1, wherein the first antenna element comprises a first dipole component formed on a surface of the circuit board and a second dipole component formed on an opposite surface of the circuit board, the second dipole component coupled to an internal ground layer of the circuit board.

11. A peripheral antenna system, comprising:
communication circuitry located in an interior area of a circuit board, the communication circuitry configured to generate an RF signal into an feed line distribution point of the circuit board;
a plurality of antenna elements, plurality of antenna elements arranged near at least two edges of the circuit board, the plurality of antenna elements substantially surrounding the communication circuitry, each of the plurality of antenna elements configured to form a directional radiation pattern when coupled to the feed line distribution point; and
a switching network configured to selectively couple the feed line distribution point to each of the plurality of antenna elements to collectively result in the generation of a configurable and substantially omnidirectional and horizontally polarized radiation pattern substantially in the plane of the circuit board.

12. The peripheral antenna system of claim 11, wherein the switching network comprises art RF switch for each of the antenna elements, the RF switch located at about a multiple of one-half wavelength from the feed line distribution point.

13. The peripheral antenna system of claim 12 further comprising a feed line coupling the RF switch to the antenna element, the feed line having an electrical length of about a multiple of one-half wavelength from the feed line distribution point.

14. The peripheral antenna system of claim 11, wherein at least one of the antenna elements comprises a modified dipole.

15. The peripheral antenna system of claim 14 further comprising at least one phase inverted modified dipole.

16. The peripheral antenna system of claim 14 further comprising a reflector for the modified dipole, the reflector configured to concentrate the radiation pattern of the modified dipole.

17. The peripheral antenna system of claim 14 further comprising a reflector for the modified dipole, the reflector configured to broaden the frequency response of the modified dipole.

18. A method for generating a radiation pattern comprising:
generating an RF signal in communication circuitry located in an interior area of a circuit board;
routing the RF signal from the communication circuitry to a feed line distribution paint of the circuit board; and
coupling the RF signal from the feed line distribution point to a first antenna element and a second antenna element, the first antenna element located near a first periphery of the circuit board, the second antenna element located near a second periphery of the circuit board, the first and second antenna elements substantially surrounding the communication circuitry the first antenna element configured to produce a first directional radiation pattern when coupled to the feed line distribution point the second antenna element configured to produce a second directional radiation pattern offset from the first radiation pattern when coupled to the feed line distribution point, wherein the first and second directional radiation patterns collectively produce a substantially omnidirectional and horizontally polarized radiation pattern substantially in the plane of the circuit board when the first antenna element and the second antenna element are coupled to the feed line distribution point.

19. The method of claim 18, wherein coupling the RF signal from the feed line distribution point to the first antenna element comprises enabling an RF switch, the RF switch coupled to the circuit board at about a multiple of one-half wavelength of the RF signal from the feed line distribution point.

20. The method of claim 19, wherein the RF switch comprises a PIN diode.

21. The method of claim 19, wherein the RF switch is coupled to the circuit board at an offset from the multiple of one-half wavelength of the RF signal from the feed line distribution point, the offset based upon a stray capacitance of at least one of the feed line distribution point and the RF switch.

22. The method of claim 18, wherein coupling the RF signal to the first antenna element and the second antenna element comprises energizing a first feed line of the circuit board and a second feed line of the circuit board, the second feed line comprising about a multiple of one-half wavelength as compared to the first feed line.

23. The method of claim 18, wherein coupling the RF signal to the first antenna element and the second antenna element comprises routing the RF signal to the first antenna element and the second antenna element so that the first antenna element is substantially in phase with the second antenna element.

24. The meted of claim 18, wherein the first periphery and the second periphery are on substantially opposite edges of the circuit board.

25. The method of claim 18, wherein the first antenna element comprises a modified dipole.

26. The method of claim 25, wherein the first antenna element further comprises a reflector.

27. A peripheral antenna system, comprising:
communication circuitry located in an interior area of a circuit board, the communication circuitry configured to generate an RF signal into a feed line distribution point of the circuit board;
first means for radiating the RF signal in a first directional radiation pattern, the first means formed in a first periphery of the circuit board;
second means for radiating the RF signal in a second directional radiation pattern offset from the first directional radiation pattern, the second means formed in a second periphery of the circuit board; and
means for coupling the feed line distribution point to the first means for radiating the RF signal and the second means for radiating the RF signal, wherein the first means and the second means substantially surround the communication circuitry and the first and second means collectively produce substantially omnidirectional and horizontally polarized radiation coverage substantially in the plane of the circuit board when the first means and the second means are coupled to the Feedline distribution point.

28. The peripheral antenna system of claim 27, wherein the first means for radiating the RF signal comprises means for concentrating the first directional radiation pattern.

29. The peripheral antenna system of claim 27, wherein the means for coupling further comprises means for selectively coupling the feed line distribution point to the first means and the second means.

30. A circuit board, comprising:
  a feed line distribution point configured to distribute an RF signal generated by communication circuitry located in an interior area of the circuit board;
  a first antenna element located near a first periphery of the circuit board, the first antenna element configured to produce a first directional radiation pattern when coupled to the RF signal; and
  a second antenna element located near a second periphery of the circuit board, the second antenna element configured to produce a second directional radiation pattern offset from the first directional radiation pattern, wherein the first and second antenna elements substantially surround the communication circuitry and the first and second antenna elements collectively produce substantially omnidirectional and horizontally polarized radiation coverage substantially in the plane of the circuit board when coupled to the RF signal.

31. The circuit board of claim 30 further comprising a switching network adapted to receive a first RF switch and a second RF switch, the switching network configured to couple the feed line distribution point to the first antenna element when the first RF switch is enabled and to the second antenna element when the second RF switch is enabled.

32. The circuit board of claim 31, wherein the switching network is configured with the first RF switch at about a multiple of one-half wavelength of the RF signal from the feed line distribution point.

33. The circuit board of claim 30, wherein the first antenna element comprises a modified dipole.

34. The circuit board of claim 33, wherein the first antenna element further comprises a reflector, the reflector configured to concentrate the radiation pattern of the first antenna element.

35. The circuit board of claim 33, wherein the first antenna element further comprises a reflector, the reflector configured to broaden the frequency response of the first antenna element.

36. The circuit board of claim 30, wherein the first antenna element comprises a first dipole component formed on a surface of the circuit board, a second dipole component formed on an opposite surface of the circuit board, the second dipole component coupled to an internal ground layer of the circuit board.

* * * * *

INTER PARTES REEXAMINATION CERTIFICATE (0347th)
United States Patent
Shtrom et al.

(10) Number: US 7,193,562 C1
(45) Certificate Issued: Feb. 21, 2012

(54) CIRCUIT BOARD HAVING A PERIPHERAL ANTENNA APPARATUS WITH SELECTABLE ANTENNA ELEMENTS

(75) Inventors: Victor Shtrom, Sunnyvale, CA (US); Darin T. Milton, Campbell, CA (US); William S. Kish, Saratoga, CA (US)

(73) Assignee: Ruckus Wireless, Inc., Mountain View, CA (US)

Reexamination Request:
No. 95/001,078, Sep. 4, 2008

Reexamination Certificate for:
Patent No.: 7,193,562
Issued: Mar. 20, 2007
Appl. No.: 11/022,080
Filed: Dec. 23, 2004

Related U.S. Application Data

(60) Provisional application No. 60/630,499, filed on Nov. 22, 2004.

(51) Int. Cl.
*H01Q 1/38* (2006.01)
*H01Q 3/24* (2006.01)
*H01Q 9/28* (2006.01)

(52) U.S. Cl. .................. 343/700 MS; 343/795; 343/876

(58) Field of Classification Search .................. None
See application file for complete search history.

(56) References Cited

To view the complete listing of prior art documents cited during the proceeding for Reexamination Control Number 95/001,078, please refer to the USPTO's public Patent Application Information Retrieval (PAIR) system under the Display References tab.

*Primary Examiner* — Deandra Hughes (57) ABSTRACT

A circuit board for wireless communications includes communication circuitry for modulating and/or demodulating a radio frequency (RF) signal and an antenna apparatus for transmitting and receiving the RF signal, the antenna apparatus having selectable antenna elements located near one or more peripheries of the circuit board. A first antenna element produces a first directional radiation pattern; a second antenna element produces a second directional radiation pattern offset from the first radiation pattern. The antenna elements may include one or more reflectors configured to provide gain and broaden the frequency response of the antenna element. A switching network couples one or more of the selectable elements to the communication circuitry and provides impedance matching regardless of which or how many of the antenna elements are selected. Selecting different combinations of antenna elements results in a configurable radiation pattern; alternatively, selecting several elements may result in an omnidirectional radiation pattern.

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 11-17 are cancelled.
Claims 1-10 and 18-36 were not reexamined.

* * * * *